United States Patent
Gu

(10) Patent No.: US 12,038,725 B2
(45) Date of Patent: Jul. 16, 2024

(54) BIPOLAR TIME-TO-DIGITAL CONVERTER

(71) Applicant: Intel Corporation, Santa Clara, CA (US)

(72) Inventor: Zheng Gu, Kaarst (DE)

(73) Assignee: Intel Corporation, Santa Clara, CA (US)

( * ) Notice: Subject to any disclaimer, the term of this patent is extended or adjusted under 35 U.S.C. 154(b) by 793 days.

(21) Appl. No.: 17/021,973

(22) Filed: Sep. 15, 2020

(65) Prior Publication Data

US 2022/0083011 A1 Mar. 17, 2022

(51) Int. Cl.
*H03M 1/50* (2006.01)
*G04F 10/00* (2006.01)
*H03L 7/085* (2006.01)
*H03M 1/06* (2006.01)

(52) U.S. Cl.
CPC ............ *G04F 10/005* (2013.01); *H03L 7/085* (2013.01); *H03M 1/0602* (2013.01)

(58) Field of Classification Search
CPC ..... G04F 10/005; H03L 7/085; H03M 1/0602
USPC ....................................................... 341/166
See application file for complete search history.

(56) References Cited

U.S. PATENT DOCUMENTS

| | | | |
|---|---|---|---|
| 9,231,602 B1* | 1/2016 | Banin | G04F 10/005 |
| 2011/0248753 A1* | 10/2011 | Leistner | H03L 7/085 |
| | | | 327/156 |
| 2017/0293265 A1* | 10/2017 | Salle | H03M 1/1009 |
| 2018/0076821 A1* | 3/2018 | Loke | H03L 7/0996 |

* cited by examiner

*Primary Examiner* — Jean B Jeanglaude
(74) *Attorney, Agent, or Firm* — Schwabe, Williamson & Wyatt, P.C.

(57) ABSTRACT

A bipolar TDC apparatus with a phase detection and signal switching circuitry and a phase error measurement circuitry. The phase detection and signal switching circuitry include a multiplexer and phase detector, together referred to as PD_MUX. The PD_MUX is used to handle the order of the two input signal phases of a TDC, or in other words, to enable TDC the bipolarity detection of the phase error. The apparatus detects first the polarity of the phase error and then prepares the right phase order when they arrive at the TDC measurement elements of the phase error measurement circuitry to ensure that always the earlier one starts the TDC and the later one triggers the measurement event. As such, the phase measurement circuitry (or measurement block) provides the phase error magnitude information, while the PD_MUX provides the sign—polarity information.

20 Claims, 10 Drawing Sheets

BIPOLAR TIME-TO-DIGITAL CONVERTER

BACKGROUND

A conventional time-to-digital converter (TDC) compares a phase difference of two input signals in a time domain and converts it into digital information. The phases of the two signals normally need to have a specific order to ensure a correct operation in a TDC structure. TDC measurement elements in the TDC structure must be started first with an "earlier" phase before the measurement action being taken with a "later" one. One problem here is that, since only unipolar detections can be done, a reversed order will either not enable a correct TDC operation and cause an invalid output or will need to wait a long time for the next proper order (e.g., in the case of two inputs being periodical clocks) requiring an unpractically large measurement range. This would cause difficulty in a digital phase-locked loop (DPLL) utilizing a TDC during the locking phase where the phase relationship of the two inputs is uncontrolled. The other problem could also occur in the locked condition if one of the two phases is modulated. The phase relationship, in this case, is known. However, to cover this dynamic range of phase error caused by the modulation, TDC needs to have a large offset (i.e. a long average run time) to guarantee the right phase order, which induces significant jitter and power penalties.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
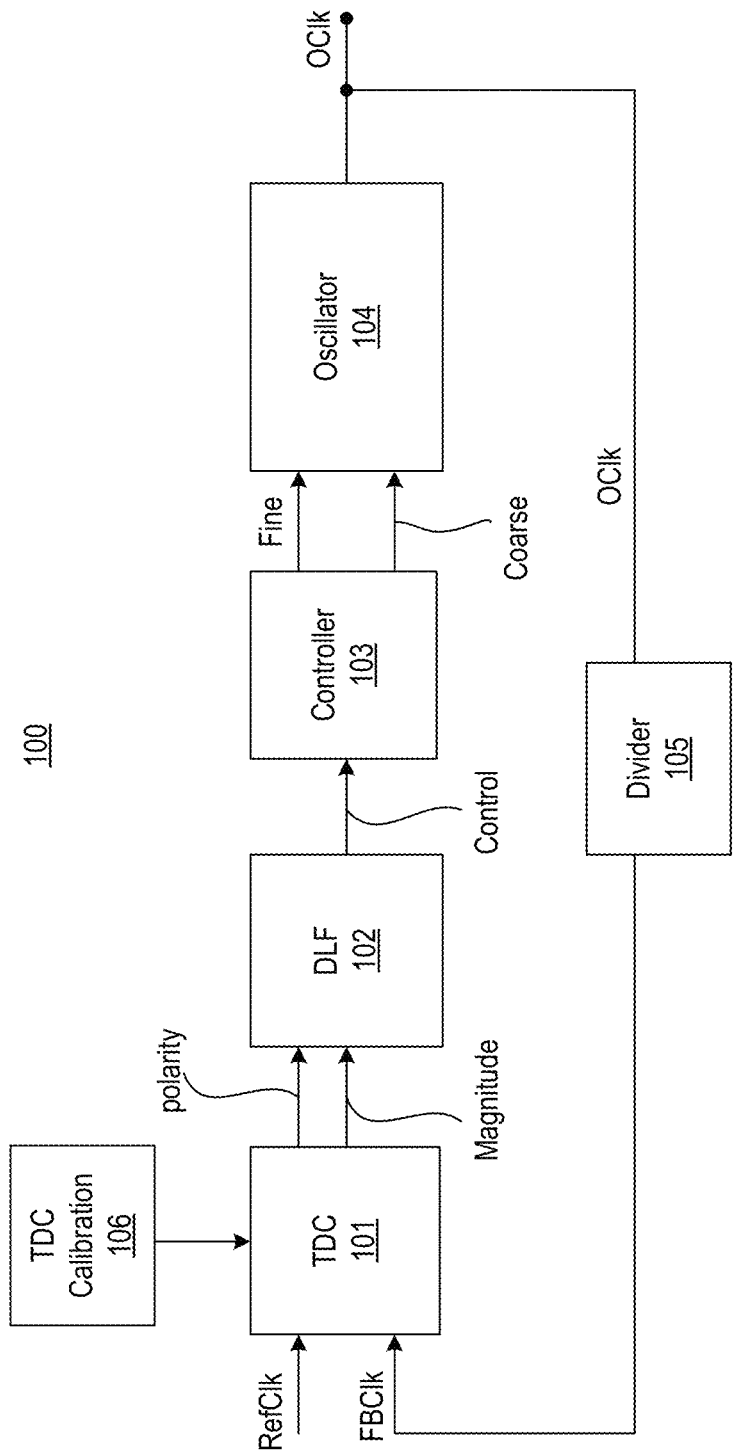
FIG. 1 illustrates a digital phase locked loop (DPLL) with bipolar TDC, in accordance with some embodiments.

One solution to overcome the limitation described in the background section is to use two TDCs to operate simultaneously but on opposite input phase orders and take the valid output of two. The other solution is to ensure a proper order by adding enough offset or by performing phase shifting before TDC operations. Two TDCs increase the design costs like chip area, power and digital complexity. Adding offset or doing phase shifting does not resolve completely the locking robustness issue and has the jitter and power penalties.

Some embodiments, describe a bipolar TDC apparatus that comprises a phase detection and signal switching circuitry and a phase error measurement circuitry. The phase detection and signal switching circuitry include a multiplexer and phase detector, together referred to as PD_MUX. In some embodiments, the PD_MUX is used to handle the order of the two input signal phases of a TDC, or in other words, to enable bipolarity detection of the phase error. The apparatus detects the polarity of the phase error and then prepares the right phase order when they arrive at the TDC measurement elements of the phase error measurement circuitry to ensure that always the earlier one starts the TDC and the later one triggers the measurement event. As such, the phase measurement circuitry (or measurement block) provides the phase error magnitude information, while the PD_MUX provides the sign—polarity information.

In some embodiments, the apparatus comprises a first circuitry to detect a polarity of phase difference between a first signal and a second signal. In some embodiments, the apparatus comprises a second circuitry to switch an order of the first signal and the second signal according to the polarity; and a third circuitry to measure the phase difference. In some embodiments, the first circuitry includes a first sequential circuitry that receives the first signal at a clock input of the first sequential circuitry, wherein the first sequential circuitry has a data input which is hardwired. In some embodiments, the first circuitry includes a second sequential circuitry that receives the second signal at a clock input of the second sequential circuitry, wherein the second sequential circuitry has a data input which is hardwired.

In some embodiments, the first circuitry includes an arbiter that receives a first output of the first sequential circuitry and a second output of the second sequential circuitry, and generates the polarity of phase difference between the first signal and the second signal according to the first output and the second output. In some embodiments, the arbiter comprises an SR (Set-Reset) latch. In some embodiments, the second circuitry comprises a multiplexer controllable by the polarity. In some embodiments, a first delay stage is coupled to the first output and a first input of the second circuitry. In some embodiments, a second delay stage is coupled to the second output and a second input of the second circuitry. In some embodiments, the first delay stage and the second delay stage have programmable delays.

In some embodiments, the third circuitry comprises: a plurality of sequential units, a plurality of delay stages, and a decoder. In some embodiments, an individual sequential unit receives a first output of the second circuitry as clock input. In some embodiments, an input of a first delay stage of the plurality receives a second output of the second circuitry, wherein an output of an individual delay stage is received as a data input of the individual sequential unit. In some embodiments, the decoder is coupled to outputs of the plurality of sequential units, wherein an output of the decoder is a magnitude indicative of a measure of the phase difference.

There are many technical effects of the various embodiments. For example, the bipolar TDC increases the robustness and noise performance of a digital phase locked loop (DPLL). Since the DPLL is the heart of the clocking system in modern integrated circuits and is instantiated multiple times in a system-on-chip (SoC) design, a compact, robust, low-power and low-noise DPLL utilizing a bipolar TDC brings performance, power and cost benefits to SoCs. Other technical effects will be evident from the various figures and embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "analog signal" is any continuous signal for which the time varying feature (variable) of the signal is a representation of some other time varying quantity, i.e., analogous to another time varying signal.

The term "digital signal" is a physical signal that is a representation of a sequence of discrete values (a quantified discrete-time signal), for example of an arbitrary bit stream, or of a digitized (sampled and analog-to-digital converted) analog signal.

The term "scaling" generally refers to converting a design (schematic and layout) from one process technology to another process technology and may be subsequently being reduced in layout area. In some cases, scaling also refers to upsizing a design from one process technology to another process technology and may be subsequently increasing layout area. The term "scaling" generally also refers to downsizing or upsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

FIG. 1 illustrates a digital phase locked loop (PLL) 100 with bipolar TDC, in accordance with some embodiments. PLL 100 comprises bipolar TDC 101, digital loop filter (DLF) 102, controller 103 (or finite state machine), oscillator 104, and divider 105. In some embodiments, PLL 100 include a calibration circuitry 106 to calibrate TDC 101. In some embodiments, TDC 101 includes a phase detection and signal switching circuitry and a phase error measurement circuitry. The phase detection and signal switching circuitry include PD_MUX. In some embodiments, the PD_MUX is used to handle the order of the two input signal phases, reference clock (RefClk) and feedback clock (FBClk) of TDC, or in other words, to enable TDC the bipolarity detection of the phase error. In some embodiments, bipolar TDC 101 detects first the polarity of the phase error and then prepares the right phase order when they arrive at the TDC measurement elements of the phase error measurement circuitry to ensure that always the earlier one starts the TDC and the later one triggers the measurement event. As such, the phase measurement circuitry (or measurement block) provides the phase error magnitude information, while the PD_MUX provides the sign—polarity information.

The output of TDC 101 is a sign (polarity) and magnitude indicative of a phase error between RefClk and FBClk. This output is received by DLF 102 that that filters that output of TDC 101 using predetermined or programmable coefficients in a digital filter. The output of DLF 102 is used by controller 103 to generate fine and/or coarse codes (digital words) that set the delay conditions, and hence oscillating frequency, of oscillator 104. In some embodiments where oscillator 104 comprises an LC-tank, the output of DLF 102 controls the resonance frequency of the LC-tank.

Here, a fine code may change the oscillation frequency by a smaller step while the coarse code changes the oscillation frequency by a larger step. Oscillator 104 can be any suitable oscillator such as digital controlled oscillator (DCO), inductor-capacitor (LC-Oscillator), etc. The output OClk of oscillator 104 is provided as clock to downstream logic and is also divided by divider 105 to generate FBClk. Divider 105 may be an integer divider or fractional divider. In some embodiments, a sigma delta modulator modulates the divider ratio which can cause the phase and/or frequency of the FBClk to vary relative to the RefClk. As the FBClk moves relative to the RefClk, bipolar TDC 101 make sure that always the earlier one of FBClk or RefClk starts the TDC and the later one of FBClk or RefClk triggers the measurement event, in accordance with some embodiments. While the embodiments here illustrate an all-digital PLL (DPLL), bipolar TDC 101 can be used in place of a phase detector in analog or mixed-signal PLLs where oscillator 104 is an analog oscillator.

Figure 2:
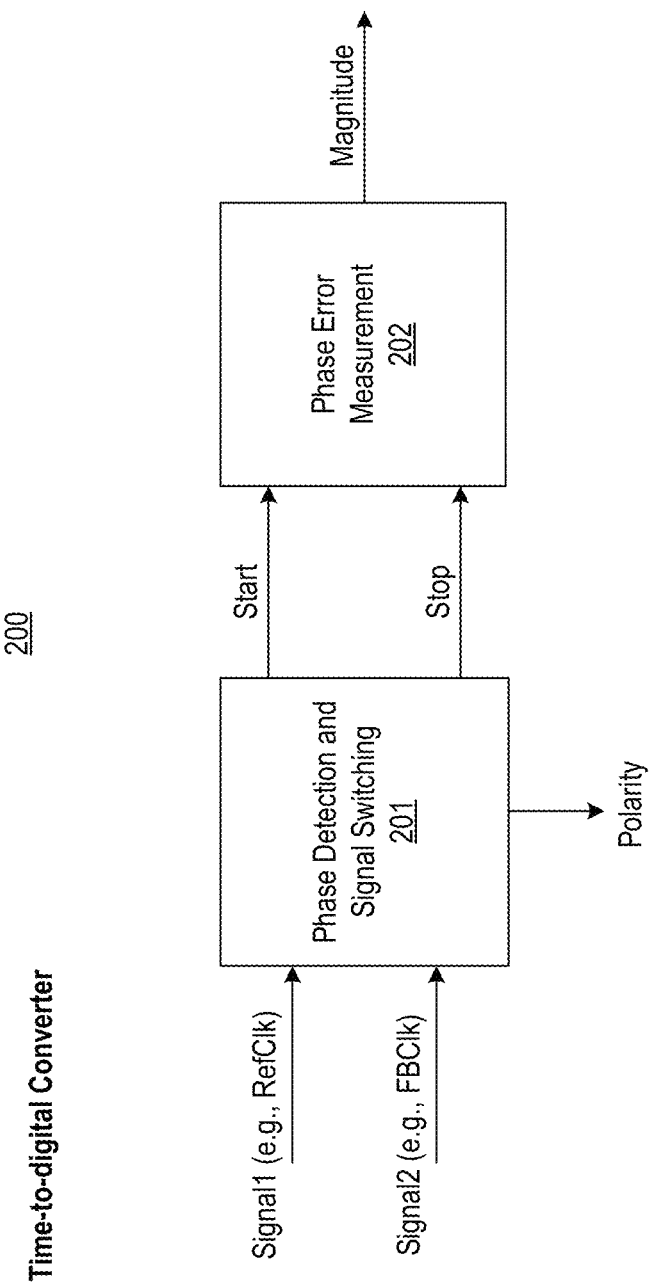
FIG. 2 illustrates a high-level architecture of a bipolar TDC, in accordance with some embodiments.

FIG. 2 illustrates a high-level architecture of bipolar TDC 200, in accordance with some embodiments. TDC 200 comprises phase detection and signal switching circuitry 201 and phase error measurement circuitry 202. In various embodiments, circuitry 201 performing phase detection and signal switching is added in front of phase error measurement block 202. In various embodiments, phase detection and signal switching circuitry 201 detects the phase error polarity of signal1 and signal2 in advance. Signal1 can be the RefClk and signal2 can be the FBClk when TDC is used in a PLL. In other usage cases, signal1 and signal2 can be other signals. Based on the detected polarity, phase detection and signal switching circuitry 201 feeds always the earlier signal to trigger the "start" operation of the measurement by circuitry 202. And the later signal will be used as the "stop" signal to trigger the measurement event in circuitry 202. In some embodiments, the signal order adjustment is being performed by a controlled switching multiplexer in circuitry 201. The output of phase error measurement circuitry 202 is the magnitude of phase difference between signal1 and signal2.

Figure 3:
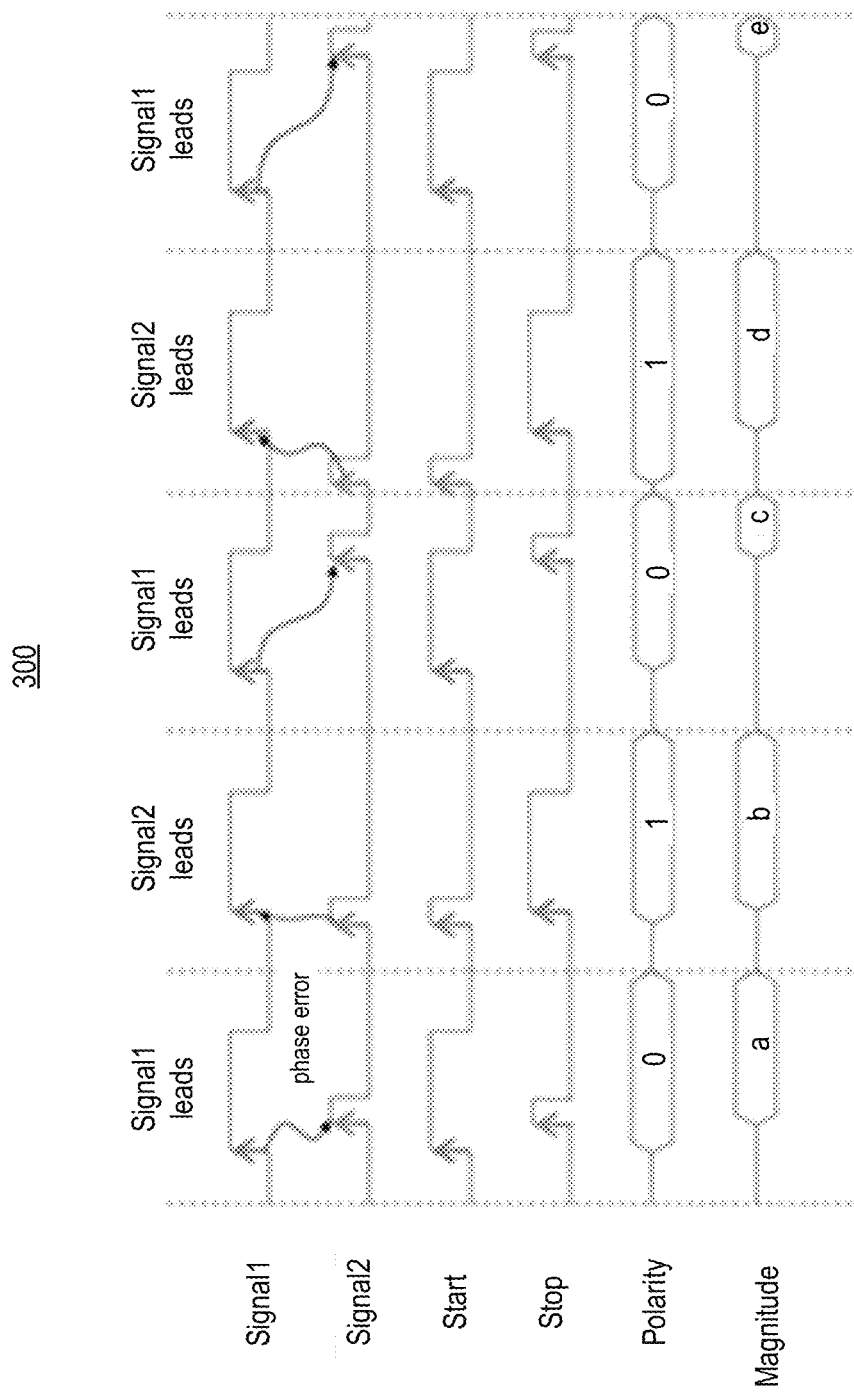
FIG. 3 illustrates a plot of a timing diagram of the bipolar TDC, in accordance with some embodiments.

FIG. 3 illustrates plot 300 of a timing diagram of the bipolar TDC, in accordance with some embodiments. Plot 300 depicts signals in different cases of signal1 to signal2 phase orders. In this example, TDC 200 is assumed as rising-edge sensitive. The "polarity" and "magnitude" information comprise finally the complete digital detection output.

Figure 4:
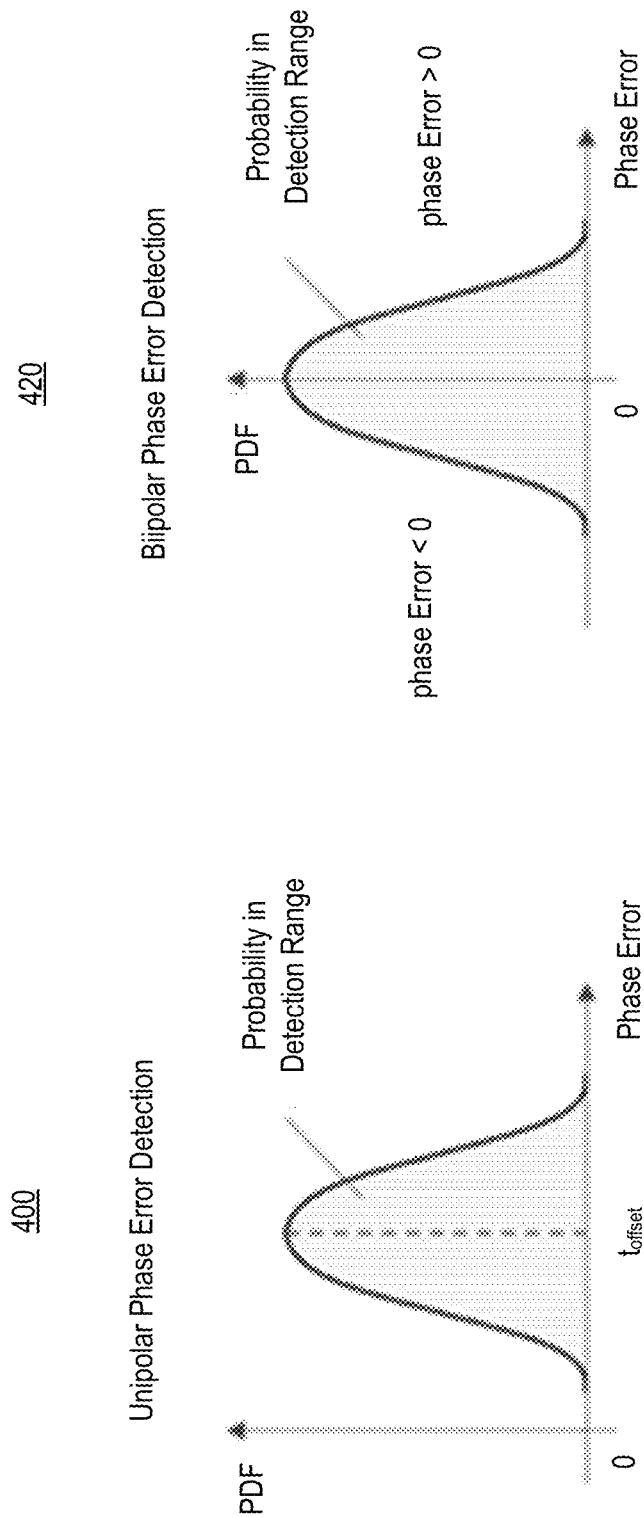
FIGS. 4A-B illustrate a detection range comparison between unipolar and bipolar detections, in accordance with some embodiments.

FIGS. 4A-B illustrate plots 400 and 420 showing detection range comparison between unipolar and bipolar detections, respectively, in accordance with some embodiments. Plots 400 and 420 compare the detection range difference between a conventional (unipolar) TDC and bipolar TDC 200. Unlike a unipolar TDC, the phase error distribution (expressed in terms of probability density function (PDF) in the figure) of a bipolar TDC, in the case of a modulation for an example, can cover both the positive and the negative ranges. This makes the phase offset ($t_{offset}$) redundant and reduces also the maximum phase error magnitude in the detection. The detection range of bipolar TDC 200 can be symmetrical centered around zero.

Figure 5:
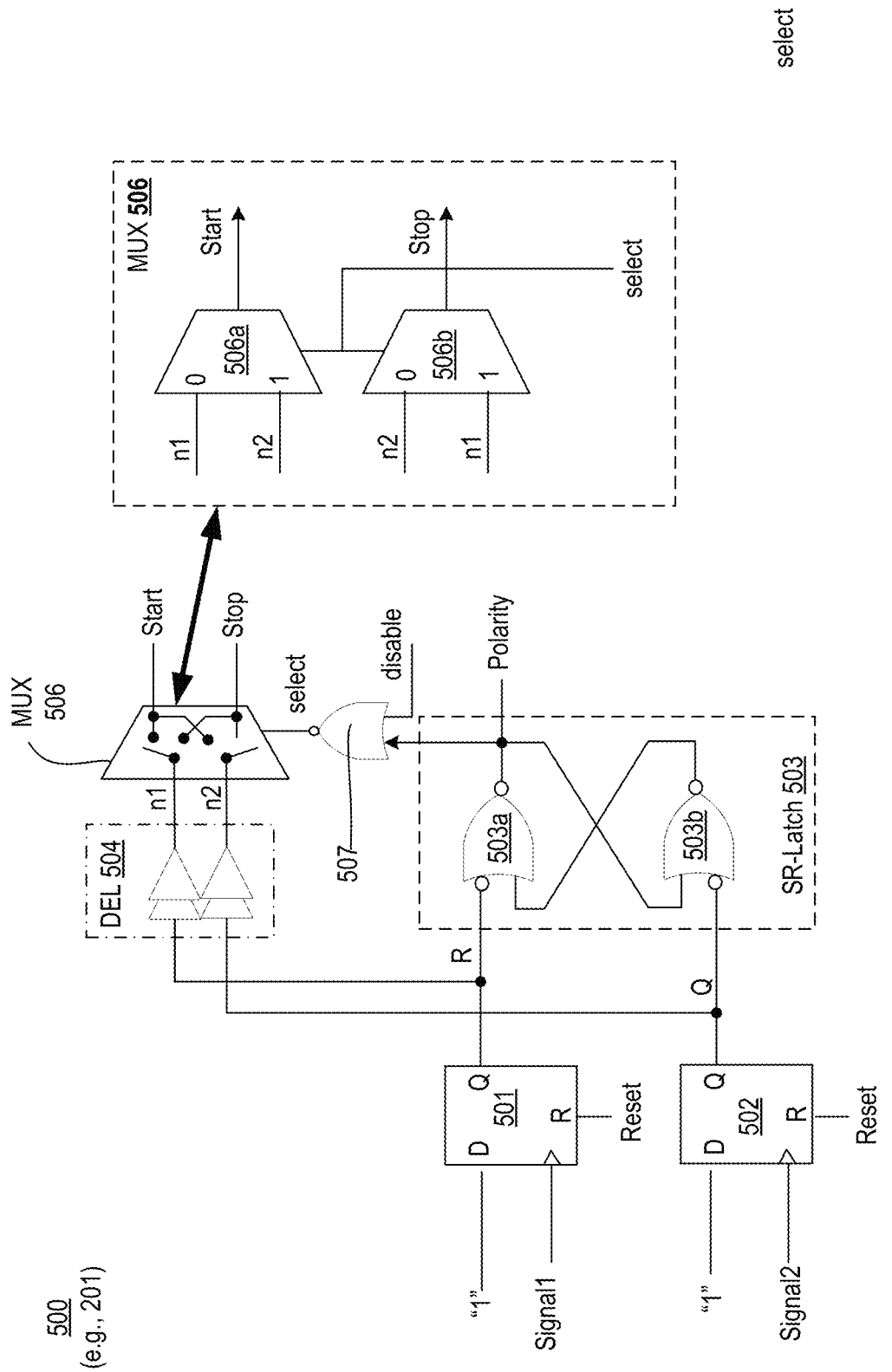
FIG. 5 illustrates a schematic of a phase detection and signal switching circuitry of the bipolar TDC, in accordance with some embodiments.

FIG. 5 illustrates a schematic of a phase detection and signal switching circuitry 500 (e.g., 201) of bipolar TDC 200, in accordance with some embodiments. In some embodiments, phase detection and signal switching circuitry 500 comprises sequential units 501 and 502 (also referred to as first sequential unit 501 and second sequential unit 502), arbiter 503, delay stages (DEL) 504, and multiplexer (MUX) 506 coupled as shown. In various embodiments, first sequential unit 501 and second sequential unit 502 comprise flip-flops (e.g., first flip-flop (FF) 501 and second FF 502) with resets. Any suitable flip-flop implementation may be used. For example, FFs 501 and 502 are D-flip-flops with scan gadgets for debug.

In some embodiments, data input (D) of first FF 501 and second FF 502 is tied to logic high (e.g., supply node). The clock input of first FF 501 is coupled to signal1 while the clock input of second FF 502 is coupled to signal2. Both FFs 501 and 502 are resettable by Reset. The output Q of first FF 501 is R while the output Q of second FF 502 is Q.

In various embodiments, both R and Q are received by arbiter 503 that generates the polarity signal which indicates whether signal1 is ahead of signal2. The polarity signal is used as a select signal for MUX 506 to swap or keep same the start and stop outputs according to the arrival times of signals R and Q. MUX 506 can be implemented as a combination of multiplexers 506a and 506b, both controlled by select signal (e.g., same or derived from the polarity signal). Nodes n1 and n2 (outputs of DEL 504) are input to multiplexers 506a and 506b that swap them according to the polarity indication.

Here, node names and signal names are interchangeably used. For example, R and Q may refer to signals R and Q or nodes R and Q depending on the context of the sentence. In various embodiments, buffers 504 (or delay stages) with predetermined delay or programmable delay are added to the signal paths of signals R and Q. The delay is primarily used to compensate the intrinsic delay of SR-latch 503 to make sure the select signal to MUX 506 arrives prior to its inputs from DEL 504. The delay is chosen to additionally overcome the metastability resolution time of arbiter 503. In various embodiments, arbiter 503 is a set-reset (SR) latch. In some embodiments, SR latch 503 comprises cross-coupled NOR gate 503a and 503b where the output of NOR gate 503a is fed as input of NOR gate 503b, while the output of NOR gate 503b is fed as input to NOR gate 503a. In some embodiments, output R is inverted before NOR operation is performed by NOR 503a. In some embodiments, output Q is inverted before NOR operation is performed by NOR 503b. While the embodiments, illustrates SR latch with NOR gates, they can also be implemented with NAND gate or other suitable logic gates.

In various embodiments, FFs 501 and 502 catch the rising edges of the input signals signal1 and signal2, which carry their phase information. Next, SR-latch 503 senses both edges and decides on which one comes first. This polarity information afterward determines the right selection of multiplexer 506 before the delayed edges arrive at the multiplexer input via buffers 504. The reset signal initializes the states of FFs and SR-latch before each new detection, in accordance with some embodiments.

In some embodiments, a phase detection and signal switching circuitry 500 (e.g., 201) of bipolar TDC 200 comprises NOR gate 507 that receives polarity and disable as inputs. The output of NOR gate 507 is the select signal to control MUX 506. In some embodiments, setting disable=0 activates the bipolar mode (i.e. signal switching) by MUX 506, while setting disable=1 deactivates the bipolar mode. When bipolar mode is disabled, TDC 200 operates in a conventional unipolar mode. In the bipolar mode, the signal select, which is an inversion of the polarity signal, controls the selection of inputs n1 and n2 by MUX 506 (e.g., the signal at input 0 of multiplexers 506a and 506b are selected if select=0, Otherwise, the signal at input 1 of multiplexers 506a and 506b are sent to the outputs Start and Stop). A person skilled in the art can replace NOR gate 507 with any other suitable gate (or multiplexer) to achieve the same stated purpose discussed herein.

Figure 6:
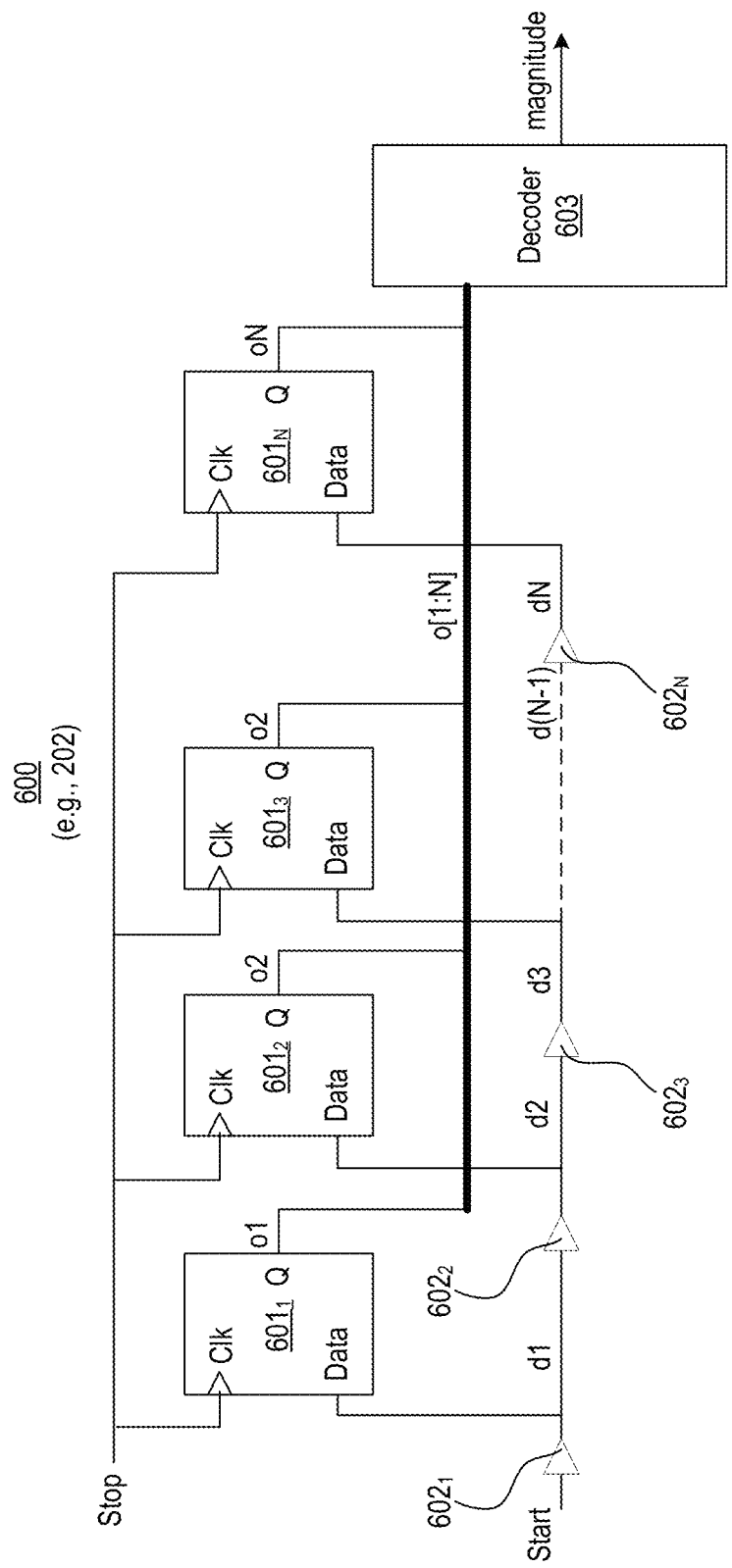
FIG. 6 illustrates a schematic of a phase error measurement circuitry of the bipolar TDC, in accordance with some embodiments.

FIG. 6 illustrates a schematic of a phase error measurement circuitry 600 (e.g., 202) of bipolar TDC 200, in accordance with some embodiments. Phase error measurement circuitry 600 comprises a plurality of sequential units $601_{1-N}$ (e.g., FFs, $601_{1-N}$), where N is an integer, delay buffers or stages $602_{1-N}$, and decoder 603. The start and stop signals from phase detection and signal switching circuitry 201. The stop signal is received as clock for each FF $601_{1-N}$. The data signal is the start signal which is delayed by a buffer before it is input to the data input of a corresponding FF. For example, start signal is delayed by buffer $602_1$ and the delayed signal d1 is input as Data input to FF $601_1$. As such, delayed output d2, d3, . . . d(N−1) and dN are received by data input of respective FFs $601_2$, $601_3$, $601_{(N-1)}$, and $601_N$. The outputs (o1, o2, o3, . . . oN) of each FF is decoded by decoder 603. Decoder receives the outputs o[1:N] and converts it into magnitude. The magnitude indicates the phase different between signal1 and signal2, where the resolution of the magnitude is the propagation delay of the delay stage 602 (e.g., of a delay unit $602_1$). While the embodiments here illustrate a chain-based TDC where delay stages are coupled in a chain and output of each delay stage is input to a corresponding sequential unit, phase error measurement circuitry 202 may be implemented using a ring oscillator-based topology.

Figure 7:
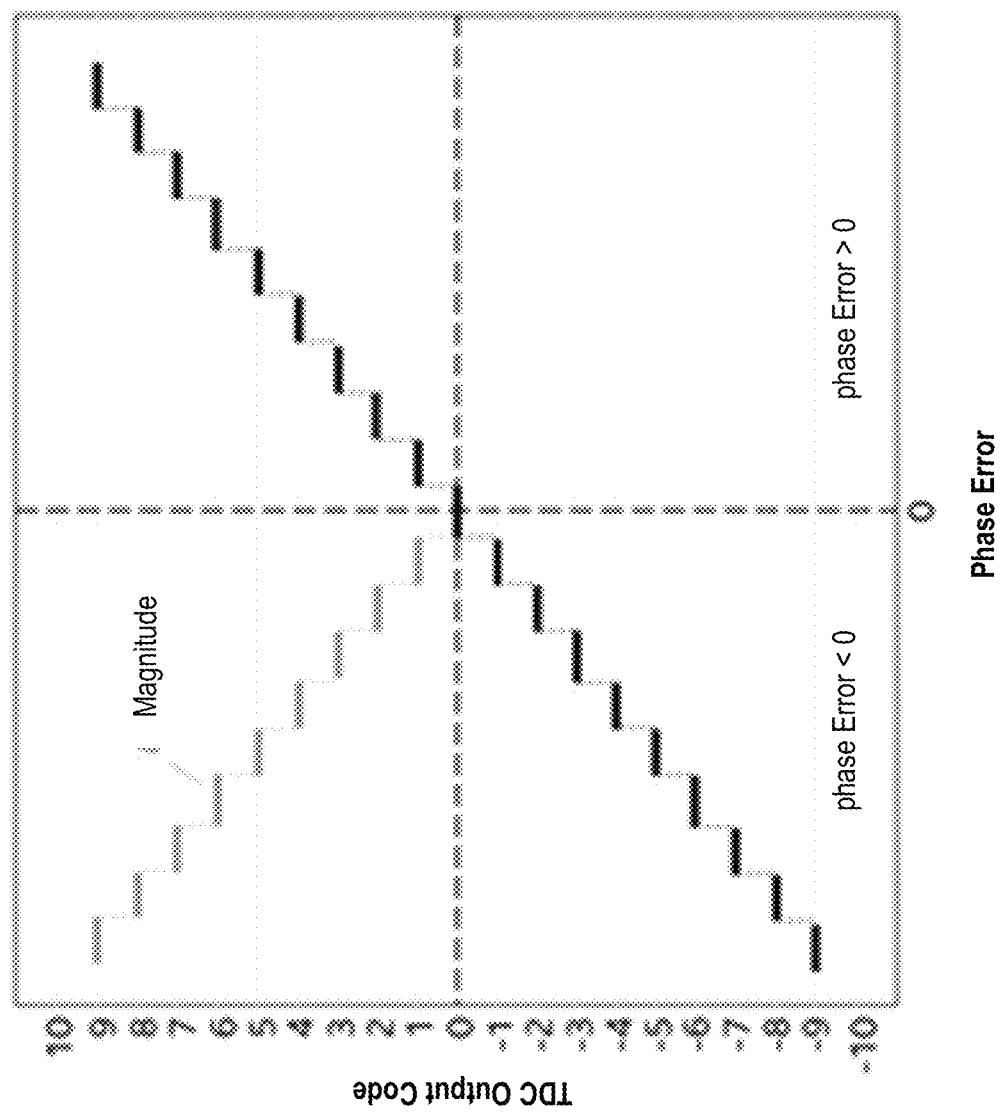
FIG. 7 illustrates a plot showing transfer function of bipolar TDC, in accordance with some embodiments.

FIG. 7 illustrates plot 700 showing transfer function of bipolar TDC 200, in accordance with some embodiments. Plot 700 shows a transfer function of a bipolar TDC that can extend into the negative phase error range. The bipolar detection capability presents several significant advantages over a conventional unipolar detection. First, the ability of the bipolar phase error measurement enhances the robustness of the DPLL locking process. Any phase relationship of TDC input signals can be correctly captured. No wrong detection or loss of phase error information may happen. Second, the effective phase error detection range of TDC in a locked state can be reduced. For example, the effective phase error detection range gets halved assuming the phase error distribution is symmetrically centered at zero phase error. This reduces the needed number of measurement elements and the used active power, which is the main power consumer of TDC. Furthermore, fewer measurement elements means also less accumulated noise on the signals because the signals now propagate through less logical gates. In the case of a detection with modulated signal, likewise, an extra offset is neither needed.

Figure 8:
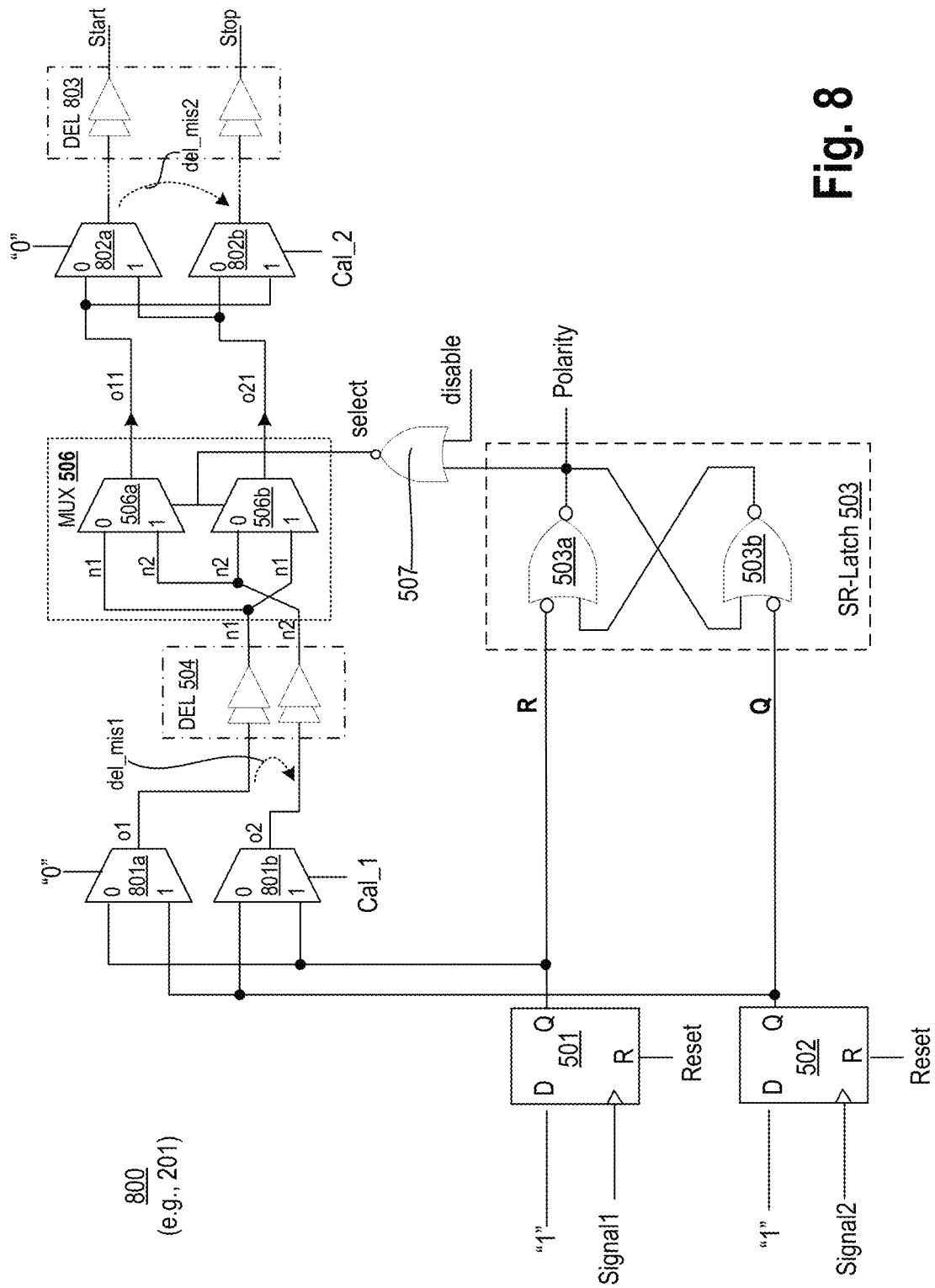
FIG. 8 illustrates a schematic of a phase detection and signal switching circuitry of the bipolar TDC with calibration, in accordance with some embodiments.

FIG. 8 illustrates a schematic of a phase detection and signal switching circuitry 800 of the bipolar TDC with calibration, in accordance with some embodiments. Circuitry 800 is similar to circuitry 500 but for addition of calibration circuitry. In some embodiments, calibration circuitry includes multiplexers 801a, 801b, 802a, and 802b coupled as shown. In some embodiments, multiplexers 801a and 801b receives inputs 'R' and 'Q' from FFs 501 and 502, respectively. In some embodiments, multiplexer 801a is programmed to select 'R' as output o2 while multiplexer 801b is programmable to select one of 'R' or 'Q' depending on the logic value of calibration signal Cal_1. The outputs o1 and o2 are input to delay stages 504. In some embodiments, the outputs o11 and o21 of multiplexers 506a and 506b, respectively, are input to multiplexers 802a and 802b. In some embodiments, multiplexer 802a is programmed to select o11 as output while multiplexer 802b is programmable to select one of o11 or o21 depending on the logic value of calibration signal Cal_2. The outputs o11 or o21 are buffered by DEL 803 and provided as outputs Start and Stop, respectively.

Since the polarity information indicates the phase order of the signals exactly at the arbiter input, any propagation delay mismatch existing between Start and Stop paths from there afterward till measurement circuitry 202 will distort the measurement results. This mismatch can be caused by random mismatches (e.g. device mismatch, manufacture mismatch, etc.) and systematic mismatches. The systematic mismatches, for instance, can come from the asymmetry of the buffer chains 602, the asymmetry of measurement circuitry 202 and any intrinsic or extrinsic offset in the measurement circuitry. To make the polarity detection information reliable for the bipolar operation, some embodiments provide apparatus for a calibration process to compensate for the mismatch error in the TDC output by digital post-processing, before the TDC output is received by DLF 102.

The mismatch can be separated into two parts and can be measured before the normal bipolar TDC operation. One part is the mismatch introduced before the signal switching ("del_mis1"). The measurement error caused by it will depend on the polarity (i.e., select) value. The other part is the mismatch introduced after the signal switching ("del_mis2"). And this measurement error is independent of the polarity. In the calibration mode, by setting Cal_1=1, disable=1, the same R signal will be fed into both paths to measure the total mismatch between Start and Stop paths starting from R and Q ("del_mis1"+"del_mis2"). By setting Cal_2=1, the same signal will be fed into both paths behind the signal switching and hence "del_mis2" will be measured. Combining the results of two calibration modes, the mismatch of each part can be calculated and used to calibrate out the error.

Figure 9:
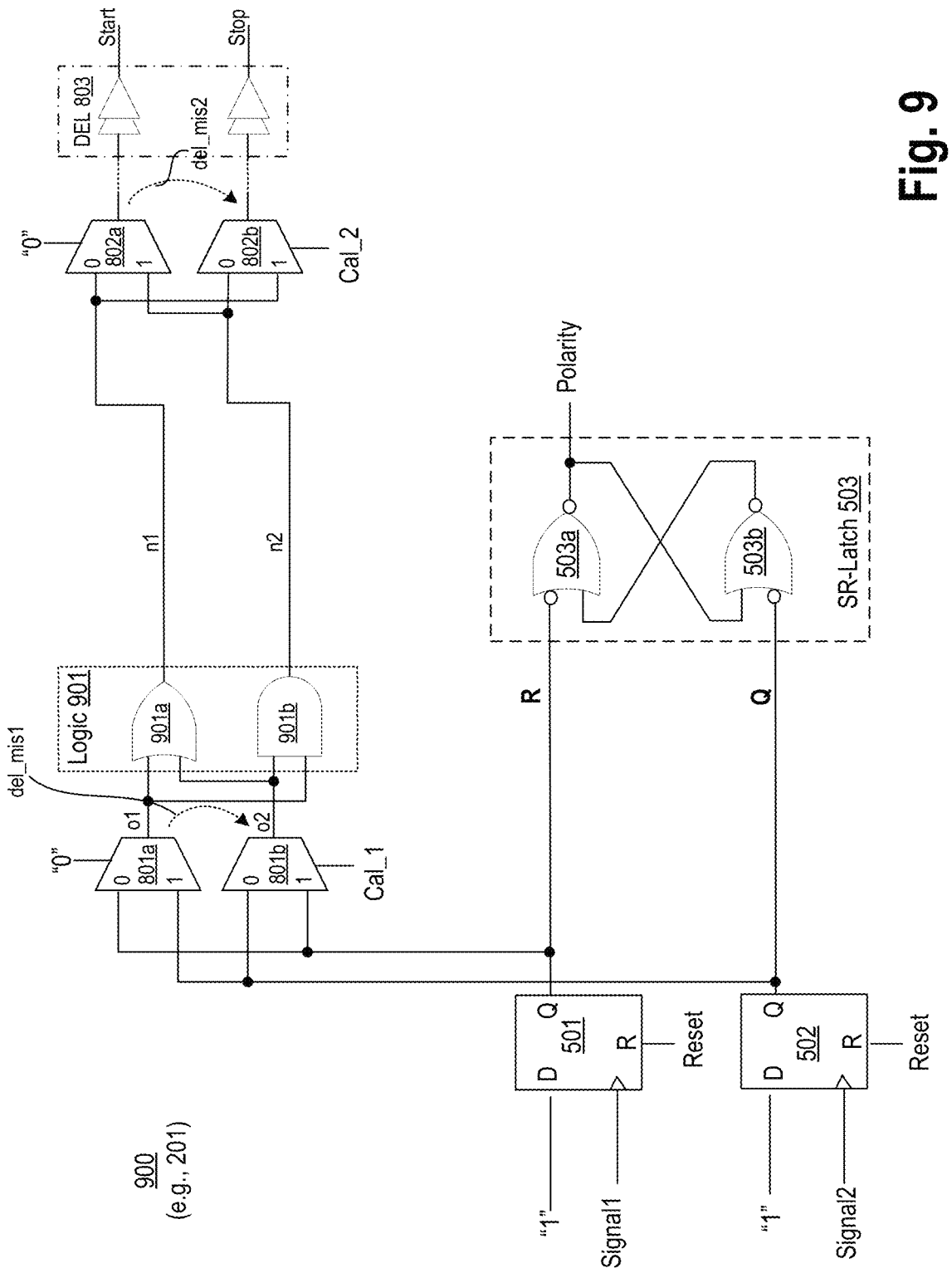
FIG. 9 illustrates a schematic of a phase detection and signal switching circuitry 900 of the bipolar TDC with calibration, in accordance with some embodiments.

FIG. 9 illustrates a schematic of a phase detection and signal switching circuitry 900 of the bipolar TDC with calibration, in accordance with some embodiments. Phase detection and signal switching circuitry 900 is similar to phase detection and signal switching circuitry 800 but for replacing delay stage 504 and MUX 506 with logic 901. In some embodiments, logic 901 includes OR gate 901a and AND gate 901b that receive outputs o1 and o2 from multiplexers 801a and 801b. The output of OR gate 901a is n1 while the output of AND gate 901b is n2. Both n1 and n2 are provided as inputs to multiplexers 801a and 802b.

In some embodiments, combinational logic unit 901 performs the signal switching autonomously without polarity information. In some embodiments, logic 901 passes the earlier rising edge of two inputs to the Start path while the later rising edge to the Stop path. And the same calibration process is applied to measure the mismatches. In some embodiments, combinational logic 901 offers a simpler implementation and saves the delay before the signal switching. But due to the tight coupling of the two signals entering the same logic gates, combinational logic 901 may introduce analog nonlinear effects when the two rising edges get closer (e.g., in the phase error range close to zero). Such, analog nonlinear effects can be calibrated separately.

Figure 10:
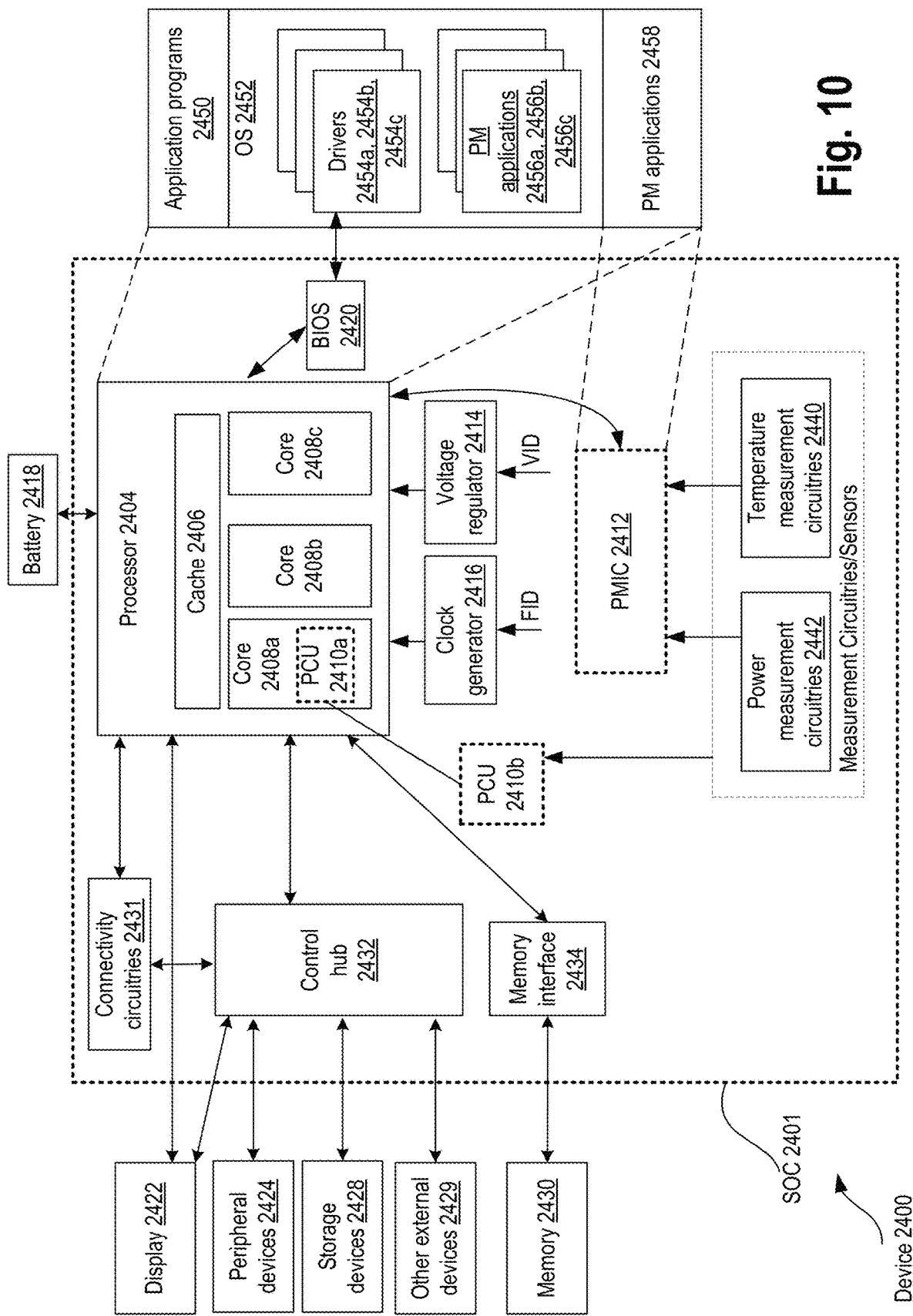
FIG. 10 illustrates a smart device or a computer system or a SoC (System-on-Chip) having a bipolar TDC, in accordance with some embodiments.

FIG. 10 illustrates a smart device or a computer system or a SoC (System-on-Chip) having a bipolar TDC, in accordance with some embodiments. In some embodiments, device 2400 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 2400.

In an example, the device 2400 comprises an SoC (System-on-Chip) 2401. An example boundary of the SoC 2401 is illustrated using dotted lines in FIG. 10, with some example components being illustrated to be included within SoC 2401—however, SoC 2401 may include any appropriate components of device 2400.

In some embodiments, device 2400 includes processor 2404. Processor 2404 can include one or more physical devices, such as microprocessors, application processors, microcontrollers, programmable logic devices, processing cores, or other processing means. The processing operations performed by processor 2404 include the execution of an operating platform or operating system on which applications and/or device functions are executed. The processing operations include operations related to I/O (input/output) with a human user or with other devices, operations related to power management, operations related to connecting computing device 2400 to another device, and/or the like. The processing operations may also include operations related to audio I/O and/or display I/O.

In some embodiments, processor 2404 includes multiple processing cores (also referred to as cores) 2408a, 2408b, 2408c. Although merely three cores 2408a, 2408b, 2408c are illustrated in FIG. 10, processor 2404 may include any other appropriate number of processing cores, e.g., tens, or even hundreds of processing cores. Processor cores 2408a, 2408b, 2408c may be implemented on a single integrated circuit (IC) chip. Moreover, the chip may include one or more shared and/or private caches, buses or interconnections, graphics and/or memory controllers, or other components.

In some embodiments, processor 2404 includes cache 2406. In an example, sections of cache 2406 may be dedicated to individual cores 2408 (e.g., a first section of cache 2406 dedicated to core 2408a, a second section of cache 2406 dedicated to core 2408b, and so on). In an example, one or more sections of cache 2406 may be shared among two or more of cores 2408. Cache 2406 may be split in different levels, e.g., level 1 (L1) cache, level 2 (L2) cache, level 3 (L3) cache, etc.

In some embodiments, processor core 2404 may include a fetch unit to fetch instructions (including instructions with conditional branches) for execution by the core 2404. The instructions may be fetched from any storage devices such as the memory 2430. Processor core 2404 may also include a decode unit to decode the fetched instruction. For example, the decode unit may decode the fetched instruction into a plurality of micro-operations. Processor core 2404 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 2404 may be an out-of-order processor core in one embodiment. Processor core 2404 may also include a retirement unit. The retirement unit may retire executed instructions after they are committed. In an embodiment, retirement of the executed instructions may result in processor state being committed from the execution of the instructions, physical registers used by the instructions being de-allocated, etc. Processor core 2404 may also include a bus unit to enable communication between components of processor core 2404 and other components via one or more buses. Processor core 2404 may also include one or more registers to store data accessed by various components of the core 2404 (such as values related to assigned app priorities and/or sub-system states (modes) association.

In some embodiments, device 2400 comprises connectivity circuitries 2431. For example, connectivity circuitries 2431 includes hardware devices (e.g., wireless and/or wired connectors and communication hardware) and/or software components (e.g., drivers, protocol stacks), e.g., to enable device 2400 to communicate with external devices. Device 2400 may be separate from the external devices, such as other computing devices, wireless access points or base stations, etc.

In an example, connectivity circuitries 2431 may include multiple different types of connectivity. To generalize, the connectivity circuitries 2431 may include cellular connectivity circuitries, wireless connectivity circuitries, etc. Cellular connectivity circuitries of connectivity circuitries 2431 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 2431 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 2431 may include a network interface, such as a wired or wireless interface, e.g., so that a system embodiment may be incorporated into a wireless device, for example, a cell phone or personal digital assistant.

In some embodiments, RF components (e.g., LTE/5G RF transceiver) of connectivity circuitries 2431 includes a bipolar a time-to-digital converter (TDC) in a phase locked loop (PLL) to generate clocks. In some embodiments, the bipolar TDC comprises a phase detection and signal switching circuitry and a phase error measurement circuitry. The phase detection and signal switching circuitry include a multiplexer and phase detector, together referred to as PD_MUX. In some embodiments, the PD_MUX is used to handle the order of the two input signal phases of a TDC, or in other words, to enable bipolarity detection of the phase error. The TDC detects the polarity of the phase error and then prepares the right phase order when they arrive at the TDC measurement elements of the phase error measurement circuitry to ensure that always the earlier one starts the TDC and the later one triggers the measurement event. As such, the phase measurement circuitry (or measurement block) provides the phase error magnitude information, while the PD_MUX provides the sign—polarity information.

In some embodiments, device 2400 comprises control hub 2432, which represents hardware devices and/or software components related to interaction with one or more I/O devices. For example, processor 2404 may communicate with one or more of display 2422, one or more peripheral devices 2424, storage devices 2428, one or more other external devices 2429, etc., via control hub 2432. Control hub 2432 may be a chipset, a Platform Control Hub (PCH), and/or the like.

For example, control hub 2432 illustrates one or more connection points for additional devices that connect to device 2400, e.g., through which a user might interact with the system. For example, devices (e.g., devices 2429) that can be attached to device 2400 include microphone devices, speaker or stereo systems, audio devices, video systems or other display devices, keyboard or keypad devices, or other I/O devices for use with specific applications such as card readers or other devices.

As mentioned above, control hub 2432 can interact with audio devices, display 2422, etc. For example, input through a microphone or other audio device can provide input or commands for one or more applications or functions of device 2400. Additionally, audio output can be provided instead of, or in addition to display output. In another example, if display 2422 includes a touch screen, display 2422 also acts as an input device, which can be at least partially managed by control hub 2432. There can also be additional buttons or switches on computing device 2400 to provide I/O functions managed by control hub 2432. In one embodiment, control hub 2432 manages devices such as accelerometers, cameras, light sensors or other environmental sensors, or other hardware that can be included in device 2400. The input can be part of direct user interaction, as well as providing environmental input to the system to influence its operations (such as filtering for noise, adjusting displays for brightness detection, applying a flash for a camera, or other features).

In some embodiments, control hub 2432 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 2422 represents hardware (e.g., display devices) and software (e.g., drivers) components that provide a visual and/or tactile display for a user to interact with device 2400. Display 2422 may include a display interface, a display screen, and/or hardware device used to provide a display to a user. In some embodiments, display 2422 includes a touch screen (or touch pad) device that provides both output and input to a user. In an example, display 2422 may communicate directly with the processor 2404. Display 2422 can be one or more of an internal display device, as in a mobile electronic device or a laptop device or an external display device attached via a display interface (e.g., DisplayPort, etc.). In one embodiment display 2422 can be a head mounted display (HMD) such as a stereoscopic display device for use in virtual reality (VR) applications or augmented reality (AR) applications.

In some embodiments, and although not illustrated in the figure, in addition to (or instead of) processor 2404, device 2400 may include Graphics Processing Unit (GPU) comprising one or more graphics processing cores, which may control one or more aspects of displaying contents on display 2422.

Control hub 2432 (or platform controller hub) may include hardware interfaces and connectors, as well as software components (e.g., drivers, protocol stacks) to make peripheral connections, e.g., to peripheral devices 2424.

It will be understood that device 2400 could both be a peripheral device to other computing devices, as well as have peripheral devices connected to it. Device 2400 may have a "docking" connector to connect to other computing devices for purposes such as managing (e.g., downloading and/or uploading, changing, synchronizing) content on device 2400. Additionally, a docking connector can allow device 2400 to connect to certain peripherals that allow computing device 2400 to control content output, for example, to audiovisual or other systems.

In addition to a proprietary docking connector or other proprietary connection hardware, device 2400 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 2431 may be coupled to control hub 2432, e.g., in addition to, or instead of, being coupled directly to the processor 2404. In some embodiments, display 2422 may be coupled to control hub 2432, e.g., in addition to, or instead of, being coupled directly to processor 2404.

In some embodiments, device 2400 comprises memory 2430 coupled to processor 2404 via memory interface 2434. Memory 2430 includes memory devices for storing information in device 2400.

In some embodiments, memory 2430 includes apparatus to maintain stable clocking as described with reference to various embodiments. Memory can include nonvolatile (state does not change if power to the memory device is interrupted) and/or volatile (state is indeterminate if power to the memory device is interrupted) memory devices. Memory device 2430 can be a dynamic random-access memory (DRAM) device, a static random-access memory (SRAM) device, flash memory device, phase-change memory device, or some other memory device having suitable performance to serve as process memory. In one embodiment, memory 2430 can operate as system memory for device 2400, to store data and instructions for use when the one or more processors 2404 executes an application or process. Memory 2430 can store application data, user data, music, photos, documents, or other data, as well as system data (whether long-term or temporary) related to the execution of the applications and functions of device 2400.

Elements of various embodiments and examples are also provided as a machine-readable medium (e.g., memory 2430) for storing the computer-executable instructions (e.g., instructions to implement any other processes discussed herein). The machine-readable medium (e.g., memory 2430) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 2400 comprises temperature measurement circuitries 2440, e.g., for measuring temperature of various components of device 2400. In an example, temperature measurement circuitries 2440 may be embedded, or coupled or attached to various components, whose temperature are to be measured and monitored. For example, temperature measurement circuitries 2440 may measure temperature of (or within) one or more of cores 2408a, 2408b, 2408c, voltage regulator 2414, memory 2430, a mother-board of SoC 2401, and/or any appropriate component of device 2400.

In some embodiments, device 2400 comprises power measurement circuitries 2442, e.g., for measuring power consumed by one or more components of the device 2400. In an example, in addition to, or instead of, measuring power, the power measurement circuitries 2442 may measure voltage and/or current. In an example, the power measurement circuitries 2442 may be embedded, or coupled or attached to various components, whose power, voltage, and/or current consumption are to be measured and monitored. For example, power measurement circuitries 2442 may measure power, current and/or voltage supplied by one or more voltage regulators 2414, power supplied to SoC 2401, power supplied to device 2400, power consumed by processor 2404 (or any other component) of device 2400, etc.

In some embodiments, device 2400 comprises one or more voltage regulator circuitries, generally referred to as voltage regulator (VR) 2414. VR 2414 generates signals at appropriate voltage levels, which may be supplied to operate any appropriate components of the device 2400. Merely as an example, VR 2414 is illustrated to be supplying signals to processor 2404 of device 2400. In some embodiments, VR 2414 receives one or more Voltage Identification (VID) signals, and generates the voltage signal at an appropriate level, based on the VID signals. Various type of VRs may be utilized for the VR 2414. For example, VR 2414 may include a "buck" VR, "boost" VR, a combination of buck and boost VRs, low dropout (LDO) regulators, switching DC-DC regulators, constant-on-time controller-based DC-DC regulator, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR, which is controlled by PCU 2410a/b and/or PMIC 2412. In some embodiments, each core has a network of distributed LDOs to provide efficient control for power management. The LDOs can be digital, analog, or a combination of digital or analog LDOs. In some embodiments, VR 2414 includes current tracking apparatus to measure current through power supply rail(s).

In some embodiments, VR 2414 includes a digital control scheme to manage states of a proportional-integral-derivative (PID) filter (also known as a digital Type-III compensator). The digital control scheme controls the integrator of the PID filter to implement non-linear control of saturating the duty cycle during which the proportional and derivative terms of the PID are set to 0 while the integrator and its internal states (previous values or memory) is set to a duty cycle that is the sum of the current nominal duty cycle plus a deltaD. The deltaD is the maximum duty cycle increment that is used to regulate a voltage regulator from ICCmin to ICCmax and is a configuration register that can be set post silicon. A state machine moves from a non-linear all ON state (which brings the output voltage Vout back to a regulation window) to an open loop duty cycle which maintains the output voltage slightly higher than the required reference voltage Vref. After a certain period in this state of open loop at the commanded duty cycle, the state machine then ramps down the open loop duty cycle value until the output voltage is close to the Vref commanded. As such, output chatter on the output supply from VR 2414 is completely eliminated (or substantially eliminated) and there is merely a single undershoot transition which could lead to a guaranteed Vmin based on a comparator delay and the di/dt of the load with the available output decoupling capacitance.

In some embodiments, device 2400 comprises one or more clock generator circuitries, generally referred to as clock generator 2416. Clock generator 2416 generates clock signals at appropriate frequency levels, which may be supplied to any appropriate components of device 2400. Merely as an example, clock generator 2416 is illustrated to be supplying clock signals to processor 2404 of device 2400. In some embodiments, clock generator 2416 receives one or more Frequency Identification (FID) signals, and generates the clock signals at an appropriate frequency, based on the FID signals.

In some embodiments, device 2400 comprises battery 2418 supplying power to various components of device 2400. Merely as an example, battery 2418 is illustrated to be supplying power to processor 2404. Although not illustrated in the figures, device 2400 may comprise a charging circuitry, e.g., to recharge the battery, based on Alternating Current (AC) power supply received from an AC adapter.

In some embodiments, device 2400 comprises Power Control Unit (PCU) 2410 (also referred to as Power Management Unit (PMU), Power Controller, etc.). In an example, some sections of PCU 2410 may be implemented by one or more processing cores 2408, and these sections of PCU 2410 are symbolically illustrated using a dotted box and labelled PCU 2410a. In an example, some other sections of PCU 2410 may be implemented outside the processing cores 2408, and these sections of PCU 2410 are symbolically illustrated using a dotted box and labelled as PCU 2410b. PCU 2410 may implement various power management operations for device 2400. PCU 2410 may include hardware interfaces, hardware circuitries, connectors, registers, etc., as well as software components (e.g., drivers, protocol stacks), to implement various power management operations for device 2400.

In some embodiments, device 2400 comprises Power Management Integrated Circuit (PMIC) 2412, e.g., to implement various power management operations for device 2400. In some embodiments, PMIC 2412 is a Reconfigurable Power Management ICs (RPMICs) and/or an IMVP (Intel® Mobile Voltage Positioning). In an example, the PMIC is within an IC chip separate from processor 2404. The may implement various power management operations for device 2400. PMIC 2412 may include hardware interfaces, hardware circuitries, connectors, registers, etc., as well as software components (e.g., drivers, protocol stacks), to implement various power management operations for device 2400.

In an example, device 2400 comprises one or both PCU 2410 or PMIC 2412. In an example, any one of PCU 2410 or PMIC 2412 may be absent in device 2400, and hence, these components are illustrated using dotted lines.

Various power management operations of device 2400 may be performed by PCU 2410, by PMIC 2412, or by a combination of PCU 2410 and PMIC 2412. For example, PCU 2410 and/or PMIC 2412 may select a power state (e.g., P-state) for various components of device 2400. For example, PCU 2410 and/or PMIC 2412 may select a power state (e.g., in accordance with the ACPI (Advanced Configuration and Power Interface) specification) for various components of device 2400. Merely as an example, PCU 2410 and/or PMIC 2412 may cause various components of the device 2400 to transition to a sleep state, to an active state, to an appropriate C state (e.g., C0 state, or another appropriate C state, in accordance with the ACPI specification), etc. In an example, PCU 2410 and/or PMIC 2412 may control a voltage output by VR 2414 and/or a frequency of a clock signal output by the clock generator, e.g., by outputting the VID signal and/or the FID signal, respectively. In an example, PCU 2410 and/or PMIC 2412 may control battery power usage, charging of battery 2418, and features related to power saving operation.

The clock generator 2416 can comprise a phase locked loop (PLL), frequency locked loop (FLL), or any suitable clock source. In some embodiments, each core of processor 2404 has its own clock source. As such, each core can operate at a frequency independent of the frequency of operation of the other core. In some embodiments, the PLL includes a time-to-digital converter (TDC) which is a bipolar TDC. In some embodiments, the bipolar TDC comprises a phase detection and signal switching circuitry and a phase error measurement circuitry. The phase detection and signal switching circuitry include a multiplexer and phase detector, together referred to as PD_MUX. In some embodiments, the PD_MUX is used to handle the order of the two input signal phases of a TDC, or in other words, to enable bipolarity detection of the phase error. The TDC detects the polarity of the phase error and then prepares the right phase order when they arrive at the TDC measurement elements of the phase error measurement circuitry to ensure that always the earlier one starts the TDC and the later one triggers the measurement event. As such, the phase measurement circuitry (or measurement block) provides the phase error magnitude information, while the PD_MUX provides the sign—polarity information.

In some embodiments, PCU 2410 and/or PMIC 2412 performs adaptive or dynamic frequency scaling or adjustment. For example, clock frequency of a processor core can be increased if the core is not operating at its maximum power consumption threshold or limit. In some embodiments, PCU 2410 and/or PMIC 2412 determines the operating condition of each core of a processor, and opportunistically adjusts frequency and/or power supply voltage of that core without the core clocking source (e.g., PLL of that core) losing lock when the PCU 2410 and/or PMIC 2412 determines that the core is operating below a target performance level. For example, if a core is drawing current from a power supply rail less than a total current allocated for that core or processor 2404, then PCU 2410 and/or PMIC 2412 can temporality increase the power draw for that core or processor 2404 (e.g., by increasing clock frequency and/or power supply voltage level) so that the core or processor 2404 can perform at higher performance level. As such, voltage and/or frequency can be increased temporality for processor 2404 without violating product reliability.

In an example, PCU 2410 and/or PMIC 2412 may perform power management operations, e.g., based at least in part on receiving measurements from power measurement circuitries 2442, temperature measurement circuitries 2440, charge level of battery 2418, and/or any other appropriate information that may be used for power management. To that end, PMIC 2412 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 2410 and/or PMIC 2412 in at least one embodiment to allow PCU 2410 and/or PMIC 2412 to manage processor core energy at least in part based on value(s) detected by one or more of the sensors.

Also illustrated is an example software stack of device 2400 (although not all elements of the software stack are illustrated). Merely as an example, processors 2404 may execute application programs 2450, Operating System 2452, one or more Power Management (PM) specific application programs (e.g., generically referred to as PM applications 2458), and/or the like. PM applications 2458 may also be executed by the PCU 2410 and/or PMIC 2412. OS 2452 may also include one or more PM applications 2456a, 2456b, 2456c. The OS 2452 may also include various drivers 2454a, 2454b, 2454c, etc., some of which may be specific for power management purposes. In some embodiments, device 2400 may further comprise a Basic Input/output System (BIOS) 2420. BIOS 2420 may communicate with OS 2452 (e.g., via one or more drivers 2454), communicate with processors 2404, etc.

For example, one or more of PM applications 2458, 2456, drivers 2454, BIOS 2420, etc. may be used to implement power management specific tasks, e.g., to control voltage and/or frequency of various components of device 2400, to control wake-up state, sleep state, and/or any other appropriate power state of various components of device 2400, control battery power usage, charging of the battery 2418, features related to power saving operation, etc.

In some embodiments, battery 2418 is a Li-metal battery with a pressure chamber to allow uniform pressure on a battery. The pressure chamber is supported by metal plates (such as pressure equalization plate) used to give uniform pressure to the battery. The pressure chamber may include pressured gas, elastic material, spring plate, etc. The outer skin of the pressure chamber is free to bow, restrained at its edges by (metal) skin, but still exerts a uniform pressure on the plate that is compressing the battery cell. The pressure chamber gives uniform pressure to battery, which is used to enable high-energy density battery with, for example, 20% more battery life.

In some embodiments, pCode executing on PCU 2410a/b has a capability to enable extra compute and telemetries resources for the runtime support of the pCode. Here pCode refers to a firmware executed by PCU 2410*a/b* to manage performance of the 2401. For example, pCode may set frequencies and appropriate voltages for the processor. Part of the pCode are accessible via OS 2452. In various embodiments, mechanisms and methods are provided that dynamically change an Energy Performance Preference (EPP) value based on workloads, user behavior, and/or system conditions. There may be a well-defined interface between OS 2452 and the pCode. The interface may allow or facilitate the software configuration of several parameters and/or may provide hints to the pCode. As an example, an EPP parameter may inform a pCode algorithm as to whether performance or battery life is more important.

This support may be done as well by the OS 2452 by including machine-learning support as part of OS 2452 and either tuning the EPP value that the OS hints to the hardware (e.g., various components of SoC 2401) by machine-learning prediction, or by delivering the machine-learning prediction to the pCode in a manner similar to that done by a Dynamic Tuning Technology (DTT) driver. In this model, OS 2452 may have visibility to the same set of telemetries as are available to a DTT. As a result of a DTT machine-learning hint setting, pCode may tune its internal algorithms to achieve optimal power and performance results following the machine-learning prediction of activation type. The pCode as example may increase the responsibility for the processor utilization change to enable fast response for user activity, or may increase the bias for energy saving either by reducing the responsibility for the processor utilization or by saving more power and increasing the performance lost by tuning the energy saving optimization. This approach may facilitate saving more battery life in case the types of activities enabled lose some performance level over what the system can enable. The pCode may include an algorithm for dynamic EPP that may take the two inputs, one from OS 2452 and the other from software such as DTT, and may selectively choose to provide higher performance and/or responsiveness. As part of this method, the pCode may enable in the DTT an option to tune its reaction for the DTT for different types of activity.

In some embodiments, VR 2414 includes a current sensor to sense and/or measure current through a high-side switch of VR 2414. In some embodiments the current sensor uses an amplifier with capacitively coupled inputs in feedback to sense the input offset of the amplifier, which can be compensated for during measurement. In some embodiments, the amplifier with capacitively coupled inputs in feedback is used to operate the amplifier in a region where the input common-mode specifications are relaxed, so that the feedback loop gain and/or bandwidth is higher. In some embodiments, the amplifier with capacitively coupled inputs in feedback is used to operate the sensor from the converter input voltage by employing high-PSRR (power supply rejection ratio) regulators to create a local, clean supply voltage, causing less disruption to the power grid in the switch area. In some embodiments, a variant of the design can be used to sample the difference between the input voltage and the controller supply, and recreate that between the drain voltages of the power and replica switches. This allows the sensor to not be exposed to the power supply voltage. In some embodiments, the amplifier with capacitively coupled inputs in feedback is used to compensate for power delivery network related (PDN-related) changes in the input voltage during current sensing.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process. The examples can be combined in any combinations. For example, example 4 can be combined with example 2.

Example 1: An apparatus comprising: a first circuitry to detect a polarity of phase difference between a first signal and a second signal; a second circuitry to switch an order of the first signal and the second signal according to the polarity; and a third circuitry to measure the phase difference.

Example 2: The apparatus of example 1, wherein the first circuitry includes: a first sequential circuitry that receives the first signal at a clock input of the first sequential circuitry, wherein the first sequential circuitry has a data input which is hardwired; and a second sequential circuitry that receives the second signal at a clock input of the second sequential circuitry, wherein the second sequential circuitry has a data input which is hardwired.

Example 3: The apparatus of example 2, wherein the first circuitry includes an arbiter that receives a first output of the first sequential circuitry and a second output of the second sequential circuitry, and generates the polarity of phase difference between the first signal and the second signal according to the first output and the second output.

Example 4: The apparatus of example 3, wherein the arbiter comprises an SR latch.

Example 5: The apparatus of example 3, wherein the second circuitry comprises a multiplexer controllable by the polarity.

Example 6: The apparatus of example 3 comprises: a first delay stage coupled to the first output and a first input of the second circuitry; and a second delay stage coupled to the second output and a second input of the second circuitry.

Example 7: The apparatus of example 6, wherein the first delay stage and the second delay stage have programmable delays.

Example 8: The apparatus of example 1, wherein the third circuitry comprises: a plurality of sequential units, wherein an individual sequential unit receives a first output of the second circuitry as clock input; a plurality of delay stages, wherein an input of a first delay stage of the plurality receives a second output of the second circuitry, wherein an output of an individual delay stage is received as a data input of the individual sequential unit; and a decoder coupled to outputs of the plurality of sequential units, wherein an output of the decoder is a magnitude indicative of a measure of the phase difference.

Example 9: An apparatus comprising: a time-to-digital converter to receive a reference clock and a feedback clock, and to generate a measure of a phase difference between the reference clock and the feedback clock, wherein the time-to-digital converter is bipolar that detects polarity of the phase difference and then orders a version of the reference clock and the feedback clock prior to measurement of the phase difference; a digital loop filter coupled to an output of the time-to-digital converter; a controller coupled to an output of the digital loop filter, wherein the controller is to generate a fine code and a coarse code; an oscillator coupled to the controller, wherein the fine code and the coarse code control an oscillating frequency of the oscillator, wherein the oscillator is to generate an output clock of the oscillating frequency; and a divider to divide a frequency of the output clock and to generate the feedback clock.

Example 10: The apparatus of example 9, wherein the time-to-digital converter is to detect a polarity of phase difference between a first signal and a second signal.

Example 11: The apparatus of example 10, wherein the time-to-digital converter is to: switch an order of the first signal and the second signal according to the polarity; and measure the phase difference.

Example 12: The apparatus of example 11, wherein the time-to-digital converter includes: a first flip-flop that receives the first signal at a clock input of the first flip-flop, wherein the first flip-flop has a data input which is hardwired; and a second flip-flop that receives the second signal at a clock input of the second flip-flop, wherein the second flip-flop has a data input which is hardwired.

Example 13: The apparatus of example 12, wherein the time-to-digital converter includes an arbiter that receives a first output of the first flip-flop and a second output of the second flip-flop, and generates the polarity of phase difference between the first signal and the second signal according to the first output and the second output.

Example 14: The apparatus of example 13, wherein the arbiter comprises an SR latch.

Example 15: The apparatus of example 13, wherein the time-to-digital converter comprises a multiplexer controllable by the polarity.

Example 16: The apparatus of example 15, wherein the time-to-digital converter comprises: a first delay stage coupled to the first output and a first input of the multiplexer; and a second delay stage coupled to the second output and a second input of the multiplexer.

Example 17: The apparatus of example 16, wherein the first delay stage and the second delay stage have programmable delays.

Example 18: The apparatus of example 15, wherein the time-to-digital converter comprises: a plurality of sequential units, wherein an individual sequential unit receives a first output of multiplexer as clock input; a plurality of delay stages, wherein an input of a first delay stage of the plurality receives a second output of the multiplexer, wherein an output of an individual delay stage is received as a data input of the individual sequential unit; and a decoder coupled to outputs of the plurality of sequential units, wherein an output of the decoder is a magnitude indicative of a measure of the phase difference.

Example 19: A system comprising: a memory; a processor coupled to the memory; a wireless interface to allow the processor to communicate with another device, wherein the processor includes a time-to-digital converter which includes circuitry to: detect a polarity of phase difference between a first signal and a second signal; switch an order of the first signal and the second signal according to the polarity; and measure the phase difference.

Example 20: The system of example 19, wherein the time-to-digital converter includes: a first sequential unit that receives the first signal at a clock input of a first sequential unit, wherein the first sequential unit has a data input which is hardwired; and a second sequential unit that receives the second signal at a clock input of the second sequential unit, wherein the second sequential unit has a data input which is hardwired.

Example 21: The system of example 20, wherein the time-to-digital converter includes an arbiter that receives a first output of the first sequential unit and a second output of the second sequential unit, and generates the polarity of phase difference between the first signal and the second signal according to the first output and the second output.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
   a first circuitry to detect a polarity of phase difference between a first signal and a second signal, wherein the first circuitry includes:
      a first sequential circuitry that receives the first signal at a clock input of the first sequential circuitry, wherein the first sequential circuitry has a data input which is hardwired; and
      a second sequential circuitry that receives the second signal at a clock input of the second sequential circuitry, wherein the second sequential circuitry has a data input which is hardwired;
   a second circuitry to switch an order of the first signal and the second signal according to the polarity; and
   a third circuitry to measure the phase difference.

2. The apparatus of claim 1, wherein the third circuitry comprises:
a plurality of sequential units, wherein an individual sequential unit receives a first output of the second circuitry as clock input;
a plurality of delay stages, wherein an input of a first delay stage of the plurality receives a second output of the second circuitry, wherein an output of an individual delay stage is received as a data input of the individual sequential unit; and
a decoder coupled to outputs of the plurality of sequential units, wherein an output of the decoder is a magnitude indicative of a measure of the phase difference.

3. The apparatus of claim 1, wherein the first circuitry includes an arbiter that receives a first output of the first sequential circuitry and a second output of the second sequential circuitry, and generates the polarity of phase difference between the first signal and the second signal according to the first output and the second output.

4. The apparatus of claim 3, wherein the arbiter comprises an SR latch.

5. The apparatus of claim 3, wherein the second circuitry comprises a multiplexer controllable by the polarity.

6. The apparatus of claim 3, further comprising:
a first delay stage coupled to the first output and a first input of the second circuitry; and
a second delay stage coupled to the second output and a second input of the second circuitry.

7. The apparatus of claim 6, wherein the first delay stage and the second delay stage have programmable delays.

8. An apparatus comprising:
a time-to-digital converter to receive a reference clock and a feedback clock, and to generate a measure of a phase difference between the reference clock and the feedback clock, wherein the time-to-digital converter is bipolar that detects polarity of the phase difference and then orders a version of the reference clock and the feedback clock prior to measurement of the phase difference;
a digital loop filter coupled to an output of the time-to-digital converter;
a controller coupled to an output of the digital loop filter, wherein the controller is to generate a fine code and a coarse code;
an oscillator coupled to the controller, wherein the fine code and the coarse code control an oscillating frequency of the oscillator, wherein the oscillator is to generate an output clock of the oscillating frequency; and
a divider to divide a frequency of the output clock and to generate the feedback clock.

9. The apparatus of claim 8, wherein the time-to-digital converter is to detect a polarity of phase difference between a first signal and a second signal.

10. The apparatus of claim 9, wherein the time-to-digital converter is to:
switch an order of the first signal and the second signal according to the polarity; and
measure the phase difference.

11. The apparatus of claim 10, wherein the time-to-digital converter includes:
a first flip-flop that receives the first signal at a clock input of the first flip-flop, wherein the first flip-flop has a data input which is hardwired; and
a second flip-flop that receives the second signal at a clock input of the second flip-flop, wherein the second flip-flop has a data input which is hardwired.

12. The apparatus of claim 11, wherein the time-to-digital converter includes an arbiter that receives a first output of the first flip-flop and a second output of the second flip-flop, and generates the polarity of phase difference between the first signal and the second signal according to the first output and the second output.

13. The apparatus of claim 12, wherein the arbiter comprises an SR latch.

14. The apparatus of claim 12, wherein the time-to-digital converter comprises a multiplexer controllable by the polarity.

15. The apparatus of claim 14, wherein the time-to-digital converter comprises:
a first delay stage coupled to the first output and a first input of the multiplexer; and
a second delay stage coupled to the second output and a second input of the multiplexer.

16. The apparatus of claim 15, wherein the first delay stage and the second delay stage have programmable delays.

17. The apparatus of claim 14, wherein the time-to-digital converter comprises:
a plurality of sequential units, wherein an individual sequential unit receives a first output of multiplexer as clock input;
a plurality of delay stages, wherein an input of a first delay stage of the plurality receives a second output of the multiplexer, wherein an output of an individual delay stage is received as a data input of the individual sequential unit; and
a decoder coupled to outputs of the plurality of sequential units, wherein an output of the decoder is a magnitude indicative of a measure of the phase difference.

18. A system comprising:
a memory;
a processor coupled to the memory;
a wireless interface to allow the processor to communicate with another device,
wherein the processor includes a time-to-digital converter which includes circuitry to:
detect a polarity of phase difference between a first signal and a second signal;
switch an order of the first signal and the second signal according to the polarity; and
measure the phase difference.

19. The system of claim 18, wherein the time-to-digital converter includes:
a first sequential unit that receives the first signal at a clock input of a first sequential unit, wherein the first sequential unit has a data input which is hardwired; and
a second sequential unit that receives the second signal at a clock input of the second sequential unit, wherein the second sequential unit has a data input which is hardwired.

20. The system of claim 19, wherein the time-to-digital converter includes an arbiter that receives a first output of the first sequential unit and a second output of the second sequential unit, and generates the polarity of phase difference between the first signal and the second signal according to the first output and the second output.

* * * * *